(12) United States Patent
Nielsen et al.

(10) Patent No.: US 6,470,191 B1
(45) Date of Patent: Oct. 22, 2002

(54) SWITCHABLE UP-CONVERSION LOOP FOR A TRANSMITTING STAGE OF A MOBILE PHONE

(75) Inventors: Anders S. Nielsen, Gistrup; Pia Thomsen, Aabybro, both of (DK)

(73) Assignee: Robert Bosch GmbH, Stuttgart (DE)

(*) Notice: Subject to any disclaimer, the term of this patent is extended or adjusted under 35 U.S.C. 154(b) by 0 days.

(21) Appl. No.: 09/430,264

(22) Filed: Oct. 29, 1999

(30) Foreign Application Priority Data

Nov. 6, 1998 (EP) .............................. 98121085

(51) Int. Cl.⁷ .............................. H04B 1/38; H04M 1/00
(52) U.S. Cl. ................ 455/552; 455/553; 455/146; 331/331.2
(58) Field of Search ................ 455/146, 552, 455/553, 118, 123, 259, 260, 264, 265, 76; 331/179, 331.2; 375/375, 376

(56) References Cited

U.S. PATENT DOCUMENTS

| | | | |
|---|---|---|---|
| 3,863,174 A | | 1/1975 | Klinger et al. |
| 4,097,816 A | | 6/1978 | Imazeki et al. |
| 4,321,706 A | * | 3/1982 | Craft .......................... 375/295 |
| 5,389,898 A | * | 2/1995 | Taketoshi et al. ............. 331/14 |
| 5,574,405 A | * | 11/1996 | Razavi ........................ 327/105 |
| 6,256,511 B1 | * | 7/2001 | Brown et al. ................ 455/314 |
| 6,269,253 B1 | * | 7/2001 | Maegawa et al. ............ 455/118 |
| 6,347,233 B1 | * | 2/2002 | Solar et al. .................. 327/164 |

FOREIGN PATENT DOCUMENTS

| | | |
|---|---|---|
| EP | 0 678 974 A2 | 10/1995 |
| GB | 2 261 345 A | 5/1993 |
| WO | 97/09786 | 3/1997 |
| WO | 98/17012 | 4/1998 |
| WO | 98/36502 | 8/1998 |

* cited by examiner

Primary Examiner—Nguyen T. Vo
Assistant Examiner—Edan Orgad
(74) Attorney, Agent, or Firm—Michael J. Striker

(57) ABSTRACT

The switchable up-conversion loop device for a transmitting stage of a mobile phone having multiple transmitting frequency bands includes a phase detector (21) for generating a phase detector output signal in response to a phase difference between an input signal and a mixing product signal, multiple switchable voltage controlled oscillators (35, 37; 100, 101, 102; 111, 112; 120), each connected to the phase detector (21) and each generating an output oscillating signal, the frequency of which depends on the phase detector output signal, and a coupling device (44; 110; 119; 121) for coupling the output oscillating signal to a mixer (26) for mixing said output oscillating signal with a locally generated oscillating signal to produce the mixing product signal.

24 Claims, 3 Drawing Sheets

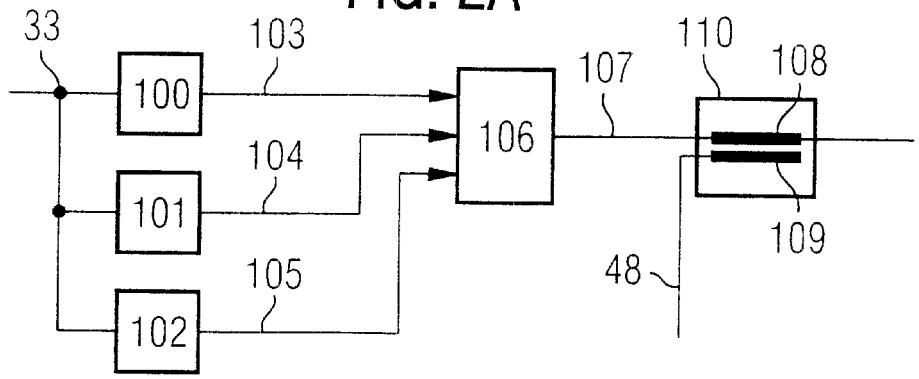
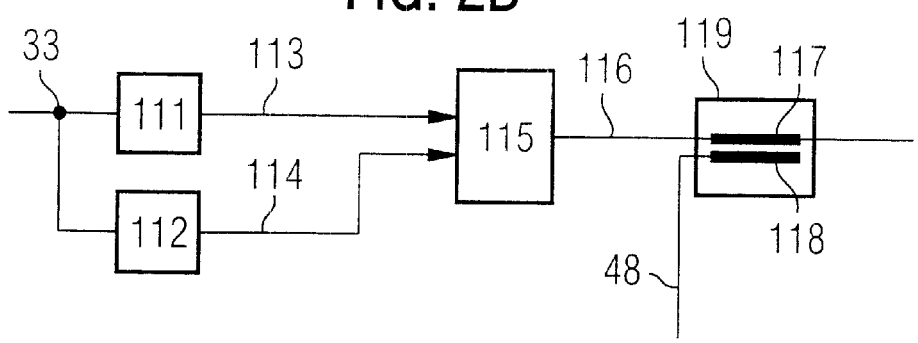
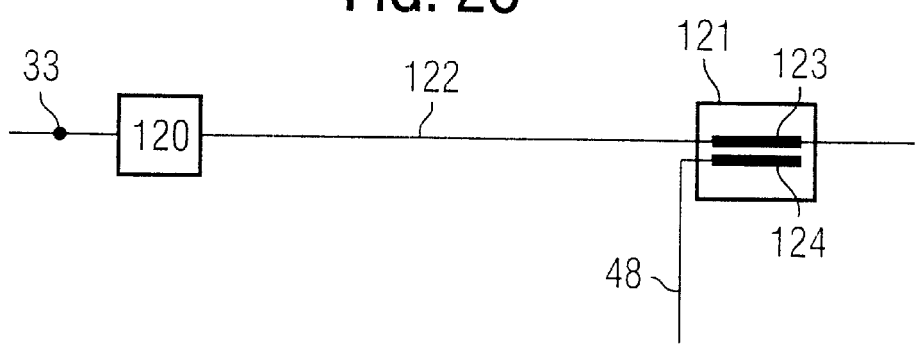

SWITCHABLE UP-CONVERSION LOOP FOR A TRANSMITTING STAGE OF A MOBILE PHONE

BACKGROUND OF THE INVENTION

1. Field of the Invention

The present invention relates to a switchable up-conversion loop device for a transmitting stage of a mobile phone.

2. Prior Art

Although applicable to any digital mobile phone system, the present invention and its underlined problems will be discussed with particular reference to a GSM mobile phone system.

The Global System for Mobile Telecommunication GSM is designed as an international digital cellular service. Originally, the 900-Megahertz band was reserved for GSM services. Since GSM first entered commercial service in 1992, it has been adapted to work at 1800 MHz for the Personal Communication Networks PCN in Europe, and at 1900 MHz for Personal Communications Services PCS in the United States. Accordingly, there are three main GSM-standards, i.e. GSM 900, GSM 1800 (PCN), and GSM 1900 (PCS). Each GSM standard specifies different frequency bands for the uplink frequency band, i.e. the communication from the mobile phone to the base station, and the downlink frequency band, i.e. the frequency band reserved for communication from the base station to the mobile stations. The uplink frequency bands or transmit frequency bands of GSM 900, GSM 1800 and GSM 1900 are respectively 890 to 915 MHz, 1710 to 1785 MHz and 1850 to 1910 MHz.

In view of the increasing mobility of people, especially of business men doing trade in different countries and continents, a mobile phone adapted to the GSM 900 standard cannot be used within a region where the GSM 1900 standard is employed. If, for instance, a business man travels from Europe where GSM 900/1800 is installed, he might not be able to communicate with this mobile phone in the United States where GSM 1900 is used.

Accordingly, it is desired to provide a switchable transmitting stage for a mobile phone, which is able to switch between different GSM standards while at the same time the complexity of the mobile phone and the additional production costs are kept at a minimum.

SUMMARY OF THE INVENTION

The invention provides a switchable up-conversion loop device for the transmitting stage of a mobile phone having the features of claim 1.

The switchable up-conversion loop device for a transmitting stage of a mobile phone having multiple transmit frequency bands according to the present invention comprises a phase detector generating a phase detector output signal in response to the phase difference between an input signal and a mixing product signal, multiple switchable voltage controlled oscillators, each connected to the phase detector via a low pass filter for generating an output oscillation signal at a frequency which depends on the phase detector output signal, a coupling means for coupling the output oscillation signal to a mixer for mixing said output oscillation signal with a locally generated oscillating signal to produce said mixing product signal.

The principal idea of the present invention resides in that a plurality of switchable voltage controlled oscillators are provided in the up-conversion loop of a transmitting stage by means of which switching between the different transmit frequency bands is achieved.

Preferred embodiments of the present invention are listed in the dependent claims.

According to a preferred embodiment, the multiple switchable voltage controlled oscillators are switched on/off by means of a switching unit which connects/interrupts the supply voltage to said voltage controlled oscillators.

This has the advantage that reliable switching without additional switching components in the signal path is achieved.

According to a further preferred embodiment, the multiple voltage controlled oscillators are selected from a group consisting of a one-band voltage controlled oscillator covering one transmit frequency band and multiple-band voltage controlled oscillators covering a plurality of transmit frequency bands.

According to a further preferred embodiment, the multiple band voltage controlled oscillator is switchable between different transmit frequency bands in response to a band switch control signal.

This has the particular advantage that the switching is performed within one voltage controlled oscillator having a plurality of transmit frequency bands thus avoiding the necessity for a set of voltage controlled oscillators which leads to a reduction of production costs.

According to a further preferred embodiment, the band switch control signal is generated by a control unit.

According to a further preferred embodiment, the switching unit is connected to said control unit which connects/interrupts the supply voltage to said voltage controlled oscillators.

According to a further preferred embodiment, said multiple-band voltage controlled oscillator consists of an oscillator transistor and multiple resonance circuits which are switchable to said oscillator transistor by means of a switching element which is controlled by said band switch control signal.

According to a further preferred embodiment, the coupling means couples the output oscillation signal either inductively or capacitively to said mixer, and normally via a directional coupler which is transmission lines.

According to a further preferred embodiment, the mixer multiplies said locally generated oscillating signal with the signal received from said coupling means.

According to a further preferred embodiment, a loop filter is provided between said phase detector and said multiple switchable voltage controlled oscillators.

According to a further preferred embodiment, the input signal of the phase detector is generated by a modulator.

According to a further preferred embodiment, the modulator is a minimum shift keying modulator.

According to a further preferred embodiment, the frequency of the input signal and of the mixing product signal are both dividable by means of frequency dividing units which are controlled by said control unit.

According to a further preferred embodiment, said multiple band voltage controlled oscillator is a two-band voltage controlled oscillator covering two transmit frequency bands.

According to a further preferred embodiment, said multiple band voltage controlled oscillator is a three-band voltage controlled oscillator covering three transmit frequency bands.

According to a further preferred embodiment, the three one-band voltage controlled oscillators are provided and connected to the phase detector, wherein each one-band voltage controlled oscillator covers one transmit frequency band.

According to a further embodiment, there is provided one one-band voltage controlled oscillator covering one transmit frequency band and one two-band voltage controlled oscillator covering two transmit frequency bands, wherein both voltage controlled oscillators are connected to said phase detector via the low pass filter.

According to a further embodiment, there is provided one three-band voltage controlled oscillator covering three different transmit frequency bands, wherein the three-band voltage controlled oscillator is connected to said phase detector.

According to a further preferred embodiment, the transmit frequency bands are transmit frequency bands of a GSM system.

According to a further preferred embodiment, there are provided three different transmit frequency bands being the transmit frequency bands of GSM 900, GSM 1800 and GSM 1900.

According to a preferred embodiment, the output oscillation signal from the coupling means is amplified by a power amplifier.

According to a further preferred embodiment, the amplified output oscillation signal is input to an antenna switching unit which switches said amplified output oscillation signal to a transmitting antenna according to a control signal from said control unit.

According to a further preferred embodiment, the mixing product signal produced by the mixer is filtered by a low pass filter to suppress unwanted mixing products.

According to a further preferred embodiment, the locally generated oscillation signal is generated by a PLL-circuit in response to a control signal from said control unit.

According to a further preferred embodiment, the supply voltage of the pre-stage amplifier is switched on/off by a switch in response to a control signal from said control unit.

BRIEF DESCRIPTION OF THE DRAWINGS

The present invention will become more fully understood by the following detailed description of the preferred embodiments thereof in conjunction with the accompanying drawings, in which:

FIGS. 2A to 2C are respective block diagrams of three different embodiments of a switchable up-conversion loop device for a transmitting stage of a mobile phone which is switchable between three different transmit frequency bands using three one-band voltage controlled oscillators, using a one-band voltage controlled oscillator and a two-band switchable voltage controlled oscillator and a three-band voltage controlled oscillator, respectively.

DESCRIPTION OF THE PREFERRED EMBODIMENTS

Figure 1:
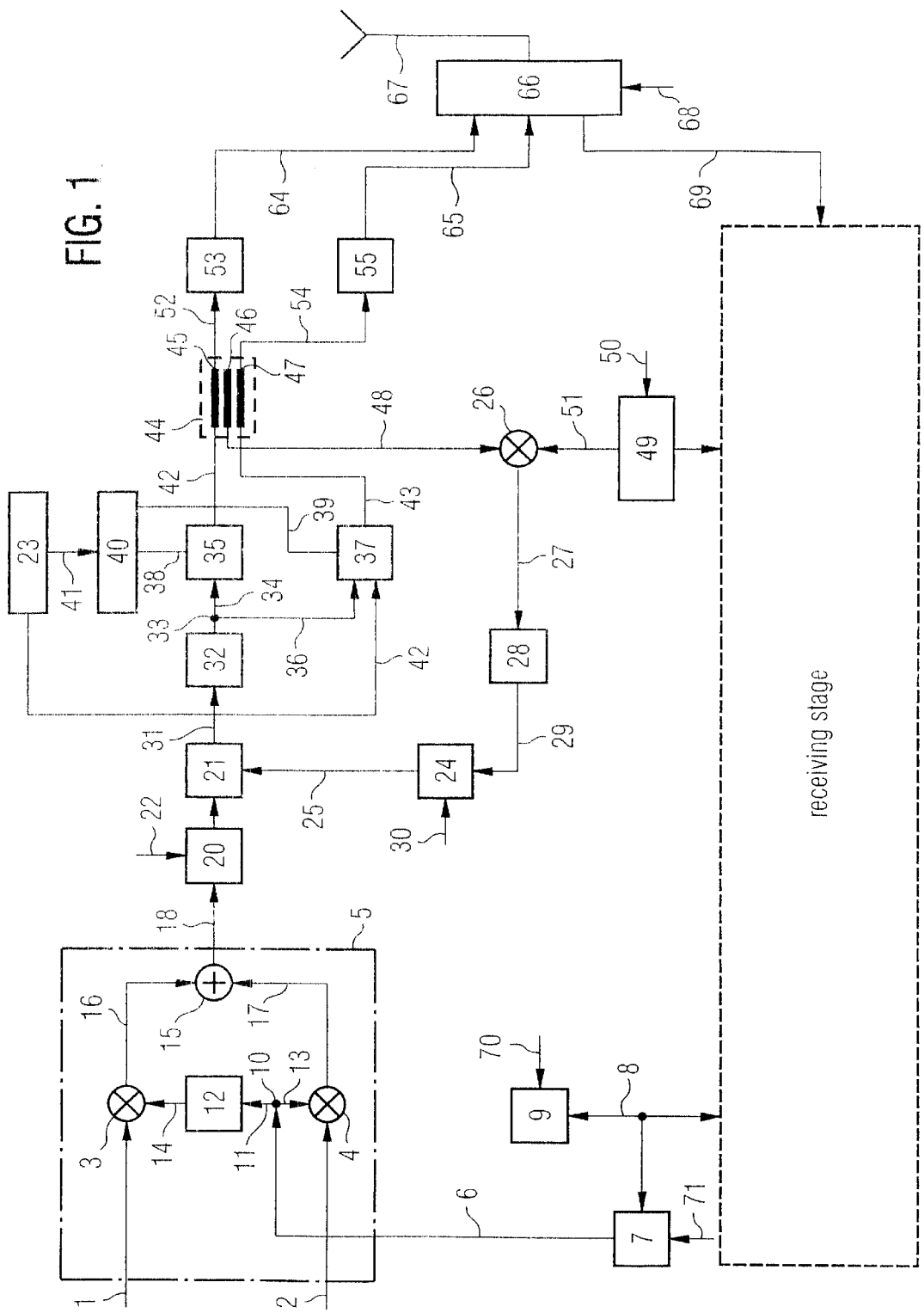
FIG. 1 is a block diagram of a preferred embodiment of the present invention, wherein a one-band voltage controlled oscillator and a two-band switchable voltage controlled oscillator are provided in the up-conversion loop of a transmitting stage for a mobile phone.

FIG. 1 shows a preferred embodiment of the switchable up-conversion loop device for a transmitting stage of a mobile phone according to the present invention.

FIG. 1 is a block diagram of a transmitting stage of a mobile phone, wherein the receiving stage is only indicated in the lower part of the block diagram in dashed lines. An information-carrying signal which is to be transmitted by the transmitting stage is supplied via lines 1, 2 to mixers 3, 4 of a modulation means 5. The modulator 5 receives via line 6 a locally generated oscillation frequency from a dividing unit 7 which divides the frequency supplied via line 8 from a voltage controlled oscillator 9. The divided locally generated oscillation frequency is supplied via line 6 to the modulator 5 and branched at a branching node 10 via line 11 to a phase shifter 12 and via line 13 to the mixer 4. The supplied oscillation frequency signal is phase-shifted by the phase-shifting means 12 by 90° and delivered to the mixer 3 on line 14. The mixer 3 multiplies the signals received on lines 1, 14 to a first mixing product signal which is supplied to a summing means 15 on line 16. The mixer 4 multiplies the signal received on lines 2, 13 to a second mixing product signal which is output to the summing means 15 on line 17. The modulator 5 shown in FIG. 1 is used as a Gaussian minimum shift key modulator.

The modulated information-carrying signal is output from the modulator 5 on line 18 to a dividing unit 20 and a phase detector 21. The dividing unit 20 divides the frequency received from the modulator by a fixed or predetermined integer number in response to a control signal received via a control line 22 from a control unit 23. The phase detector 21 consists of a device that produces an output voltage proportional to the phase difference of the signals input from the first frequency dividing unit 20 and second frequency dividing unit 24. The second frequency dividing unit 24 is connected to the phase detector 21 via a line 25 and divides the frequency of a mixing product signal received from a mixer 26 via line 27, a low-pass filter 28 and a connecting line 29 in response to a control signal sent to the frequency dividing unit 24 via a control line 30. The loop filter 32 is a low pass filter that is used to control the PLL dynamics, and therefore the performance of the system. The output signal of the loop filter 32 is branched at node 33 via line 34 to a first voltage controlled oscillator 35 and via line 36 to a second voltage controlled oscillator 37.

In the embodiment shown in FIG. 1, the first voltage controlled oscillator 35 is a one-band voltage controlled oscillator covering one transmit frequency band, and the second voltage controlled oscillator 37 is a two-band voltage controlled oscillator covering two transmit frequency bands. Accordingly, the switchable up-conversion loop device for a transmitting stage shown in FIG. 1 covers three different transmit frequency bands.

The first voltage controlled oscillator 35 is supplied with the supply voltage via a power supply line 38, and the second voltage controlled oscillator 37 is supplied with a supply voltage via power supply line 39. The power supply lines 38, 39 of the first and second voltage controlled oscillators 35, 37 are switchable by means of a switching unit 40 which connects or interrupts the supply voltage to the voltage controlled oscillators 35, 37 in response to a switching control signal from the control unit 23 on control line 41.

According to the switch control signal on line 41, both voltage controlled oscillators 35, 37 are switched independently on or off. There is only one voltage controlled oscillator switched on at the same time. While the switching between the different voltage controlled oscillators 35, 37 is performed in response to the switch control signal on control line 41, the switching between the different transmit frequency bands within the two-band voltage controlled oscillator 37 is performed in response to a band switch control signal which is received by the two-band voltage controlled oscillator 37 on control line 42 from the control unit 23. On the output side, the two voltage controlled oscillators 35, 37 are connected by output lines 42, 43 to a coupling means 44. In the embodiment shown in FIG. 1, the coupling means 44 consists of three striplines or microstriplines 45, 46, 47, wherein the first stripline 45 is connected to the output line 42 of the first voltage controlled oscillator 35 and the third stripline 47 is connected to the output line 43 of the second voltage controlled oscillator 37. The second stripline 46 of the coupling means 44 couples part of the signal from 45 or 47 via a signal coupling line 48 to mixer 26.

The mixer 26 multiplies the received coupling signal with a locally generated oscillation signal from a PLL circuit 49 which generates an oscillation signal in response to a controlled signal received from the control unit 23 on control line 50. A connecting line 51 connects the PLL circuit 49 with mixer 26. The output signal of the first voltage controlled oscillator 35 passes on line 42 via the first coupling stripline 45 and a line 52 to a power amplifier 53. The output signal of the second voltage controlled oscillator 37 passes via line 43 the third coupling stripline 47 and via line 54 to a power amplifier 55.

The output signals of the power amplifiers 53, 55 are passed via lines 64, 65 to a switching means 66 which selectively switches the output signal on lines 64 or 65 to a transmitting/receiving antenna 67 in response to a control signal from control unit 23 wherein said control signal is received by the switching means 66 via control line 68. The control signal on control line 68 controls whether one of the output signals on the output signal lines 64, 65 are transmitted by the antenna 67 or whether the antenna is used as a receiving antenna which outputs a received signal via a received signal line 69 to the receiving stage of the mobile phone.

The locally generated oscillation signal produced by the PLL circuit 49 in response to the control signal on control line 50 and the second locally generated oscillation signal generated by the PLL circuit 9 in response to a control signal on control line 70 are generated depending on which GSM standard is used, i.e. which transmit frequency band is to be used. Accordingly, the frequency dividing unit 7, 20, 24 are controlled via control lines 71, 22, 30 to divide the received signals by a predetermined integer number depending which GSM-standard operation mode is selected by the control unit 23.

The switchable up-conversion loop device for a transmitting stage of a mobile phone shown in FIG. 1 has three transmit frequency bands, i.e. one transmit frequency band covered by the first voltage controlled oscillator 35 and two different transmit frequency bands covered by the second voltage controlled oscillator 37. In a preferred embodiment, the three transmit frequency bands are the transmit frequency bands of GSM 900, GSM 1800 and GSM 1900 which are 890 to 950 MHz for GSM 900, 1710 to 1785 MHz for GSM 1800 and 1850 to 1910 MHz for GSM 1900.

If the switchable up-conversion loop device for a transmitting stage is used for a mobile phone which is switchable between the three different GSM standards, the first voltage controlled oscillator 35 covers the transmit frequency band of GSM 900, while the switchable two-band voltage controlled oscillator 37 covers the transmit frequency band of GSM 1800 and the transmit frequency band of GSM 1900. In case that the control unit selects the GSM 900 operation mode, the first voltage controlled oscillator 35 is switched on by switching means 40 in response to the control signal on control line 41, and the second voltage controlled oscillator 37 is switched off at the same time. The PLL circuit 49 generates a first locally generated oscillation frequency determined by the selected output intermediate frequency on line 27 on the selected transmitting channel within the transmit frequency band in response to the control signal on control line 50. The frequency synthesizer 9 generates a second locally generated oscillation signal equal to the frequency at 25, given by the intermediate frequency at 27 divided by divider 24, times the dividers 7 and 20.

In case that the GSM 1800 operation mode is selected by control unit 23, the first voltage controlled oscillator 35 is switched off by switch 40, while at the same time the second voltage control oscillator 37 is switched on by switch 40 in response to the control signal on control line 41. Further, the second switchable voltage controlled oscillator 37 which covers two transmit frequency bands is switched to its first transmit frequency band being the transmit frequency band of GSM 1800, i.e. 1710 to 1785 MHz. At the same time, the PLL circuit 49 generates another first locally generated frequency signal corresponding to the selected transmit channel in response to the control signal on control line 50 and the intermediate frequency on line 27 selected for the GSM 1800 design. The voltage control oscillator 9 again generates a second locally generated frequency signal in response to control signal and control line 70.

In case that the GSM 1900 operation mode is selected by control unit 23, the second voltage controlled oscillator 37 is switched on while the first voltage controlled oscillator 35 is switched off. Within the second voltage controlled oscillator 37, the second transmit frequency band, i.e. the transmit frequency band of GSM 1900 is selected which is 1850 to 1910 MHz. At the same time, the PLL circuit 49 generates another first locally generated oscillation frequency signal depending on the selected transmit channel. The PLL circuit 9 again generates a second locally generated oscillation signal which is divided by a factor 2 by the frequency signal dividing unit 7 and supplied to the modulator 5 via line 6.

Only one path corresponding to one GSM output transmit frequency band is switched to the transmitting antenna 67 at the same time. In case that the first voltage controlled oscillator 35 generating an output frequency within the transmit frequency band of GSM 900 is switched on by means of switch 40, the power amplifier 53 is amplifying the signal received on line 52, while the power amplifier 55 is off. Further, switching means 66 switches the output signal line 64 to the transmitting antenna 67.

The embodiment shown in FIG. 1 shows a switchable up-conversion loop transmitting stage of a mobile phone having three transmit frequency bands using the one-band voltage controlled oscillator 35 and a two-band voltage controlled oscillator 37. The embodiment shown in FIG. 1 is only one possible way to construct a switchable up-conversion loop for a transmitting stage according to the present invention.

As can be seen from FIG. 2A, 2B, 2C, the circuit according to the present invention may be varied to provide a transmitting stage having three transmit frequency bands.

FIG. 2A shows a further embodiment of a transmitting stage having three transmit frequency bands according to the present invention. The output signal of the phase detector 32 is branched off at branching node 33 to three different one-band voltage controlled oscillators 100, 101, 102, each covering one transmit frequency band and outputting the voltage controlled oscillation signal via lines 103, 104, 105 to a triplexer 106 which outputs the received signals on an output line 107 to a first stripline 108 which couples to a second stripline 109 of a coupling means 110, wherein the output signal of the second stripline 109 is coupled via coupling line 48 to the mixer 26. The three one-band voltage control oscillators 100, 101, 102 are switched on/off by switching the corresponding supply voltage lines (not shown).

FIG. 2B shows a further embodiment for a three-band transmitting stage having three transmit frequency bands, wherein a one-band voltage controlled oscillator 111 and a two-band voltage controlled oscillator 112 covering two transmit frequency bands are employed and output a respective output signal on output lines 113, 114 to a diplexer 115 which outputs a voltage controlled output signal on output line 116 to a first stripline 117 which couples to a second stripline 118 which couples signals via line 48 to the mixer 26. The first and second stripline 117, 118 form the coupling means 119. The switching between the one-band voltage controlled oscillator 111 and the two-band voltage controlled oscillator 112 is performed by switching on/off the respective supply voltages, while the switching between the two different frequency bands within the two-band voltage controlled oscillator 112 is performed in response to control signal from the control unit 23.

FIG. 2C shows a further embodiment of a three-band transmitting stage having only one voltage controlled oscillator 120 which has three different transmit frequency bands. The switching between the three transmit frequency bands of the three-band voltage controlled oscillator 120 is performed in response to a control signal from the control unit 23, wherein the output voltage control signal is supplied to coupling means 121 via a line 122. The coupling means 121 is formed by two coupled striplines 123, 124, wherein the stripline 124 couples the signal via line 48 to the mixer 26.

Figure 3:
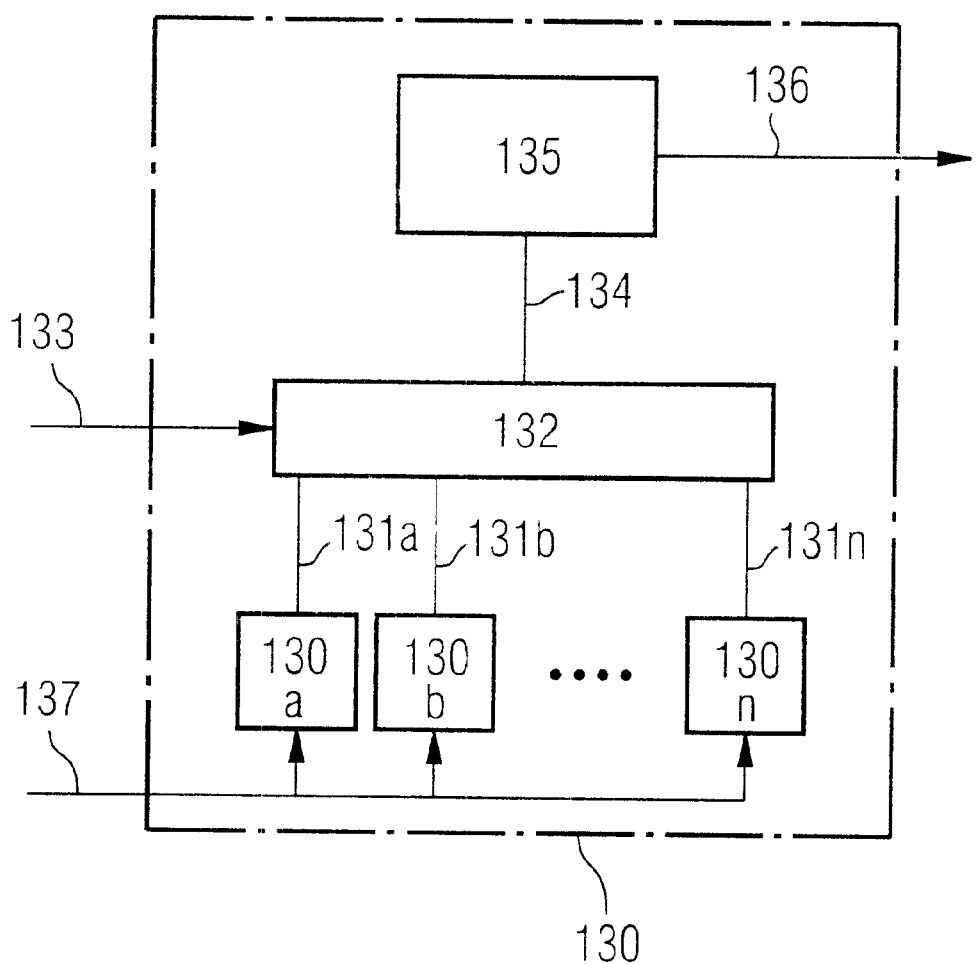
FIG. 3 is a block diagram of a multiple-band voltage controlled oscillator which is switchable between different transmit frequency bands.

FIG. 3 shows a multi-band voltage controlled oscillator used in the switchable up-conversion loop for a transmitting stage according the present invention. The multiple-band voltage controlled oscillator 130 comprises a plurality of resonance circuits 130a–130n being a part of the oscillator circuit. The resonance frequency of the oscillator is determined by the selected resonance circuit.

The resonance circuits 130a–130n are connected via lines 130a–130n to a switching means 132 connecting each of the resonance circuits 130a–130n in response to a control signal on a control line 133 via a connecting line 134 to an oscillator transistor 135 producing an output signal on an output line 136 the frequency of which is proportional to the input control voltage on an input line 137.

In case of a two-band voltage controlled oscillator, as for instance voltage controlled oscillators 37, 112, there are provided two resonance circuits 130a, 130b. In case of three-band voltage controlled oscillator, as for instance a three-band voltage controlled oscillator 120 in FIG. 2C, there are provided three resonance circuits 130a, 130b, 130c.

Although the present invention has been described with respect to preferred embodiments thereof, it should be understood that many modifications can be performed without departing from the scope of the invention as defined by the appended claims.

We claim:

1. A switchable up-conversion loop device for a transmitting stage of a mobile phone having multiple transmit frequency bands, said up-conversion loop device comprising:

a phase detector (21) generating a phase detector output signal in response to a phase difference between an input signal and a mixing product signal, multiple switchable voltage controlled oscillators (35, 37; 100, 101, 102; 111, 112; 120), each of said voltage controlled oscillators being connected to the phase detector (21) via a low pass filter (32) for generating an output oscillating signal at a frequency which depends on the phase detector output signal, and coupling means (44; 110; 119; 121) for coupling the output oscillating signal to a mixer (26) for mixing said output oscillating signal with a locally generated oscillating signal to produce said mixing product signal.

2. The switchable up-conversion loop device for a transmitting stage of a mobile phone as defined in claim 1, further comprising a switching unit (40) including means for connecting or interrupting a supply voltage to said multiple switchable voltage controlled oscillators in order to switch the multiple switchable voltage controlled oscillators (35, 37; 100, 101, 102; 111, 112; 120) on or off by means of the switching unit (40).

3. The switchable up-conversion loop device for a transmitting stage of a mobile phone as defined in claim 2, wherein the multiple switchable voltage controlled oscillators (35, 37; 100, 101, 102; 111, 112; 120) include one-band voltage controlled oscillators (35; 100, 101, 102) covering one transmit frequency band and/or multiple-band voltage controlled oscillators (37; 112; 120) covering a plurality of transmit frequency bands.

4. The switchable up-conversion loop device for a transmitting stage of a mobile phone as defined in claim 3, wherein said multiple-band voltage controlled oscillators (37; 112; 120) are switchable between said transmit frequency bands in response to a band switch control signal.

5. The switchable up-conversion loop device for a transmitting stage of a mobile phone as defined in claim 4, further comprising a control unit (23) including means for generating the band switch control signal.

6. The switchable up-conversion loop device for a transmitting stage of a mobile phone as defined in claim 2, further comprising a control unit (23) connected to said switching unit (40) and said control unit (23) connects or interrupts a supply voltage to said voltage controlled oscillators (35, 37; 100, 101, 102; 111, 112; 120) in response to an oscillator switching control signal from said control unit (23).

7. The switchable up-conversion loop device for a transmitting stage of a mobile phone as defined in claim 6, wherein said multiple switchable voltage controlled oscillators (37; 112; 120) comprise at least one multiple-band voltage controlled oscillator (135) consisting of an oscillator transistor (135), multiple resonance circuits (130a, 130b, . . . 103n) forming an oscillator circuit device together with the oscillator transistor (135), and a switching element (132) responsive to said oscillator switching control signal; and wherein a respective one of said resonance circuits is connectable to said oscillator transistor (135) by means of said switching element (132) according to said oscillator switching control signal.

8. The switchable up-conversion loop device for a transmitting stage of a mobile phone as defined in claim 1, wherein the coupling means (44; 110; 109; 121) couples the output oscillating signal into said mixer (26).

9. The switchable up-conversion loop device for a transmitting stage of a mobile phone as defined in claim 8, wherein said mixer (26) multiplies said locally generated oscillating signal with the output oscillating signal received from said coupling means (44; 110; 109; 121).

10. The switchable up-conversion loop device for a transmitting stage of a mobile phone as defined in claim 1, further comprising a loop filter (32) connected between said phase detector (21) and said multiple switchable voltage controlled oscillators.

11. The switchable up-conversion loop device for a transmitting stage of a mobile phone as defined in claim 1, further comprising a modulation means (5) for generating an input signal for said phase detector (21).

12. The switchable up-conversion loop device for a transmitting stage of a mobile phone as defined in claim 11, wherein said modulation means (5) is a minimum shift keying modulator.

13. The switchable up-conversion loop device for a transmitting stage of a mobile phone as defined in claim 12, further comprising frequency dividing units (20,24) for dividing respective frequencies of the input signal and the mixing product signal and wherein said control unit (23) includes means for controlling the frequency dividing units.

14. The switchable up-conversion loop device for a transmitting stage of a mobile phone as defined in claim 3, wherein each of said multiple-band voltage controlled oscillators is a two-band voltage controlled oscillator (37;112) covering two transmit frequency bands.

15. The switchable up-conversion loop device for a transmitting stage of a mobile phone as defined in claim 3, wherein each of the multiple-band voltage controlled oscillators is a three-band voltage controlled oscillator (120) covering three transmit frequency bands.

16. The switchable up-conversion loop device for a transmitting stage of a mobile phone as defined in claim 3, wherein three of said one-band voltage controlled oscillators (100, 101, 102) are connected to said phase detector (21) each covering one transmit frequency band.

17. The switchable up-conversion loop device for a transmitting stage of a mobile phone as defined in claim 3, wherein one of said one-band voltage controlled oscillators (35; 111 ) covering one transmit frequency band and one two-band voltage controlled oscillator (37; 112) covering two transmit frequency bands are connected to said phase detector (21).

18. The switchable up-conversion loop device for a transmitting stage of a mobile phone as defined in claim 15, wherein said three-band voltage controlled oscillator (120) covering three transmit frequency bands is connected to said phase detector (21).

19. The switchable up-conversion loop device for a transmitting stage of a mobile phone as defined in claim 1, wherein said transmit frequency bands are transmit frequency bands of a GSM system.

20. The switchable up-conversion loop device for a transmitting stage of a mobile phone as defined in claim 19, wherein said transmit frequency bands of said GSM system consist of GSM 900, GSM 1800 and GSM 1900.

21. The switchable up-conversion loop device for a transmitting stage of a mobile phone as defined in claim 1, further comprising a power amplifier (53,55) including means for amplifying the output oscillating signal from said coupling means (44; 110; 119; 121) to form an amplified output oscillating signal.

22. The switchable up-conversion loop device for a transmitting stage of a mobile phone as defined in claim 1, wherein the amplified output oscillating signal is input to an antenna switching unit (66) which switches said amplified output oscillating signal to a transmitting antenna (67) according to an antenna control signal from said control unit (23).

23. The switchable up-conversion loop device for a transmitting stage of a mobile phone as defined in claim 1, further comprising a low pass filter (28) for filtering the mixing product signal produced by said mixer (26) to suppress unwanted mixing products.

24. The switchable up-conversion loop device for a transmitting stage of a mobile phone as defined in claim 1, further comprising a PLL circuit (49) for generating the locally generated oscillating signal in response to a controlling signal generated by said control unit (23).

* * * * *